United States Patent [19]
Parkin et al.

[11] Patent Number: 6,166,948
[45] Date of Patent: Dec. 26, 2000

[54] MAGNETIC MEMORY ARRAY WITH MAGNETIC TUNNEL JUNCTION MEMORY CELLS HAVING FLUX-CLOSED FREE LAYERS

[75] Inventors: Stuart Stephen Papworth Parkin; Luc Thomas, both of San Jose, Calif.

[73] Assignee: International Business Machines Corporation, Armonk, N.Y.

[21] Appl. No.: 09/390,596

[22] Filed: Sep. 3, 1999

[51] Int. Cl.$^7$ .................................................. G11C 11/14
[52] U.S. Cl. .............................. 365/173; 365/171; 365/8; 365/158
[58] Field of Search .................... 365/173, 171, 365/8, 158

[56] References Cited

U.S. PATENT DOCUMENTS

| | | | |
|---|---|---|---|
| 5,640,343 | 6/1997 | Gallagher et al. | 365/171 |
| 5,650,958 | 7/1997 | Gallagher et al. | 365/173 |
| 5,801,984 | 9/1998 | Parkin | 365/158 |
| 5,841,692 | 11/1998 | Gallagher et al. | 365/173 |
| 5,966,012 | 10/1999 | Parkin | 324/252 |

OTHER PUBLICATIONS

S. Parkin et al., "Oscillations in Exchange Coupling and Magnetoresistance in Metallic Superlattice Structures: Co/Ru, Co/Cr, and Fe/Cr", Physical Review Letters, The American Physical Society, vol. 64, No. 19, May 7, 1990, pp. 2304–2307.

K. Moon et al., "Exchange–Biased Magnetic Tunnel Junctions: Dependence of Offset Field on Junction Width", Applied Physics Letters, American Institute of Physics, vol. 74, No. 24, Jun. 14, 1999, pp. 3690–3692.

*Primary Examiner*—David Nelms
*Assistant Examiner*—Connie C. Yoha
*Attorney, Agent, or Firm*—Thomas R. Berthold

[57] ABSTRACT

An improved magnetic tunnel junction (MTJ) memory cell for use in a nonvolatile magnetic random access memory (MRAM) array has a free layer formed as two ferromagnetic films that are magnetostatically coupled antiparallel to one another by their respective dipole fields. The magnetostatic or dipolar coupling of the two ferromagnetic films occurs across a nonferromagnetic spacer layer that is selected to prevent exchange coupling between the two ferromagnetic films. The magnetic moments of the two ferromagnetic films are antiparallel to another so that the multilayer free layer structure has a reduced net magnetic moment. In the presence of an applied magnetic field, such as during writing to the cell, the moments of the two ferromagnetic films switch directions substantially simultaneously, so that the net magnetic moment of the multilayer free layer structure can have two possible orientations relative to the orientation of the fixed or pinned layer of the MTJ cell, thus resulting in the two stable magnetic states of the MTJ cell. The reduced net magnetic moment of the multilayer free layer structure reduces the magnetostatic coupling between the multilayer free layer and the pinned ferromagnetic layer in the MTJ cell, as well as the magnetostatic coupling between adjacent MTJ cells in the array. As a result, the cells, and thus the MRAM array, can be made smaller.

17 Claims, 5 Drawing Sheets

MAGNETIC MEMORY ARRAY WITH MAGNETIC TUNNEL JUNCTION MEMORY CELLS HAVING FLUX-CLOSED FREE LAYERS

STATEMENT OF GOVERNMENT RIGHTS

The Government of the United States of America has rights in this invention pursuant to Contract No. MDA972-96-C-0030 awarded by the Defense Advanced Research Projects Agency.

TECHNICAL FIELD

This invention relates generally to magnetic devices, and more particularly to magnetic tunnel junction (MTJ) magnetic memory cells and to nonvolatile magnetic random access memory (MRAM) devices formed from an array of MTJ memory cells.

BACKGROUND OF THE INVENTION

Magnetic tunnel junctions (MTJ) form promising candidates for nonvolatile memory storage cells to enable a dense, fast, nonvolatile magnetic random access memory (MRAM). The magnetic tunnel junction comprises at least two ferromagnetic layers separated by a thin insulating layer. The conductance of the device depends on the relative magnetic orientation of the magnetic moments of the ferromagnetic layers. The lateral size of the MTJ storage cell must be of sub-micron dimensions to be competitive with today's DRAM memories with 10–100 Mbit capacities. Moreover, the lateral size of the MTJ storage cell will need to be further reduced as memory capacities further increase in the future.

The required small size of the MTJ storage cell leads to several problems. First, as the lateral dimensions of the cell are reduced, the volume of each of the magnetic layers in the MTJ device is also reduced, which leads to the possibility of "super-paramagnetic" behavior, i.e., thermal fluctuations can cause the magnetic moment of a magnetic entity to spontaneously rotate if the magnetic anisotropy of the entity, which is proportional to its volume, is not sufficiently great. For example, a ferromagnetic thin layer with lateral dimensions of ~0.3×0.3 $(\mu m)^2$ and a thickness of 100 Å, is superparamagnetic at room temperature if comprised of permalloy, which has a very low magnetic anisotropy of ~1000 $erg/cm^3$. In practice, the effective magnetic anisotropy of the ferromagnetic layer would be considerably higher, even if comprised of a material with a small magnetocrystalline anisotropy, because small magnetic elements, unless circular, possess a magnetic shape anisotropy. Indeed, as the lateral dimensions of an MTJ element are reduced, the stray magnetic fields at the edges of the element, generated by the magnetic poles at the edges of the ferromagnetic layers of the MTJ, become of ever increasing importance. On the one hand these magnetostatic fields generate an effective in-plane magnetic anisotropy which will stabilize the magnetic structure against thermal fluctuations. However, these fields, which depend on the detailed shape of the MTJ cell, can become so large when the size of the MTJ device is reduced that the write fields themselves (and their associated currents through the corresponding write and bit lines) become so large that the power consumption of the MRAM becomes too high to be competitive. More importantly, these fields can lead to large magnetic interactions between the ferromagnetic layers within a single MTJ storage cell and between ferromagnetic layers in neighboring MTJ storage cells. In the first case, the state of the MTJ cell in which the magnetic moments of the free and fixed ferromagnetic layers are antiparallel will be much more energetically stable than the state in which the moments are parallel to one another. This leads to asymmetries in the magnetic switching between the parallel and antiparallel states of the MTJ cell, making it difficult to operate the MTJ cell. In the second case, the magnetic switching field of a given MTJ cell will depend on the magnetic state of its neighboring cells, which means that the margin of write operation of the memory array is reduced, eventually making it inoperable. Unless these magnetostatic interactions can be mitigated they will eventually limit the smallest size of the MTJ cells and thus the highest density of the MTJ MRAM.

MTJ memory storage cells can be comprised of various types of structures. In one type, a hard-soft (HS) MTJ, one of the ferromagnetic layers is designed to be magnetically "hard" (high coercivity) and have a very large magnetic switching field, while the other ferromagnetic layer is magnetically "soft" (low coercivity). The two memory states of the cell correspond to the soft layer having its magnetic moment oriented either parallel or antiparallel to the fixed moment of the hard layer. An improved HS MTJ is described in IBM's U.S. Pat. No. 5,801,984. In another type of MTJ, an exchange-biased (EB) MTJ, the magnetic moment of one of the ferromagnetic layers is fixed or pinned by exchange biasing it with an antiferromagnetic layer, and only the orientation of the magnetic moment of the free ferromagnetic layer is changed during read and write operations. An EB MTJ is described in IBM's U.S. Pat. No. 5,650,958.

For the EB MTJ the magnetostatic fields emanating from the exchange-biased pinned layer can be greatly reduced by replacing this layer with a sandwich of two ferromagnetic films antiferromagnetically coupled to one another by a thin antiferromagnetic coupling film, as described in IBM's U.S. Pat. No. 5,841,692. In this type of structure (also called an antiparallel pinned or AP pinned layer) the antiferromagnetic coupling film must be selected from a list of known materials and must be of a special thickness to give rise to the exchange coupling between the two ferromagnetic films in the sandwich. This AP pinned structure is based on the discovery of oscillatory coupling, as described in detail by Parkin et al. in "Oscillations in Exchange Coupling and Magnetoresistance in Metallic Superlattice Structures: Co/Ru, Co/Cr and Fe/Cr", *Phys. Rev. Lett.*, Vol. 64, p. 2034 (1990). The magnetic moments of the two ferromagnetic films in the AP pinned layer are aligned antiparallel to one another so that the net magnetic moment of the AP pinned layer is reduced compared to a pinned layer comprised of a single ferromagnetic layer. Since the strength of the magnetostatic field from a ferromagnetic layer is proportional to the net magnetic moment of the layer, the magnetostatic field from the AP pinned layer comprised of two antiferromagnetically coupled ferromagnetic layers is less than that of a pinned layer comprised of a single ferromagnetic layer.

It is also possible to reduce the strength of the magnetostatic fields emanating from the edges of the free ferromagnetic layer in a HS or EB MTJ by forming the free ferromagnetic layer from a sandwich of two antiferromagnetically coupled ferromagnetic films, as described in IBM's pending U.S. patent application Ser. No. 08/947,282 filed Oct. 7, 1997. However, this may have disadvantages. First, the antiferromagnetic coupling film is extremely thin so that the thermal stability of the antiferromagnetically coupled sandwich may not be adequate for the required lithographic and patterning processing steps to which the MTJ materials will be subjected. Second, the magnetic properties of the antiferromagnetically coupled sandwich may be inferior to that of the individual ferromagnetic films because of incomplete antiferromagnetic coupling of these films if the films are not, for example, extremely smooth. Also in an EB MTJ it is usually preferable to deposit the metallic antiferromagnetic layer and the pinned ferromagnetic layer to which it is exchange-biased first in order to achieve optimal exchange biasing. This is because metallic layers grown on top of the insulating tunnel barrier, which is usually formed from an amorphous layer of $Al_2O_3$, may be rougher than the layers formed beneath the tunneling barrier. Typically metal layers do not "wet" oxide layers so that thin metal layers deposited on oxide layers are comprised of numerous islands of varying sizes and heights. Such metal layers are necessarily rough. Moreover, such layers will be poorly crystallographically textured. For these reasons, not only is it very difficult to prepare very thin ferromagnetic free layers with good magnetic properties but it may also be difficult to prepare antiferromagnetically coupled free layers with appropriate magnetic properties.

What is needed is a MTJ memory cell with an improved ferromagnetic free layer with reduced magnetostatic stray fields.

SUMMARY OF THE INVENTION

The invention is an improved MTJ cell and a MRAM array using the improved cells. The MTJ cell has a free layer comprised of two ferromagnetic films that are magnetostatically coupled antiparallel to one another by their respective dipole fields. The magnetostatic or dipolar coupling of the two ferromagnetic films occurs across a nonferromagnetic spacer layer that is selected to prevent exchange coupling between the two ferromagnetic films. The magnetic moments of the two ferromagnetic films are antiparallel to another so that the multilayer free layer structure has a reduced net magnetic moment. In the presence of an applied magnetic field, such as during writing to the cell, the moments of the two ferromagnetic films switch directions substantially simultaneously, so that the net magnetic moment of the multilayer free layer structure can have two possible orientations relative to the orientation of the fixed or pinned layer of the MTJ cell, thus resulting in the two stable magnetic states of the MTJ cell. The reduced net magnetic moment of the multilayer free layer structure reduces the magnetostatic coupling between the multilayer free layer and the pinned ferromagnetic layer in the MTJ cell, as well as the magnetostatic coupling between adjacent MTJ cells in the array. As a result, the cells, and thus the MRAM array, can be made smaller.

For a fuller understanding of the nature and advantages of the present invention, reference should be made to the following detailed description taken together with the accompanying figures.

DETAILED DESCRIPTION OF THE PREFERRED EMBODIMENTS

Prior Art MTJ Array

Figure 1A:
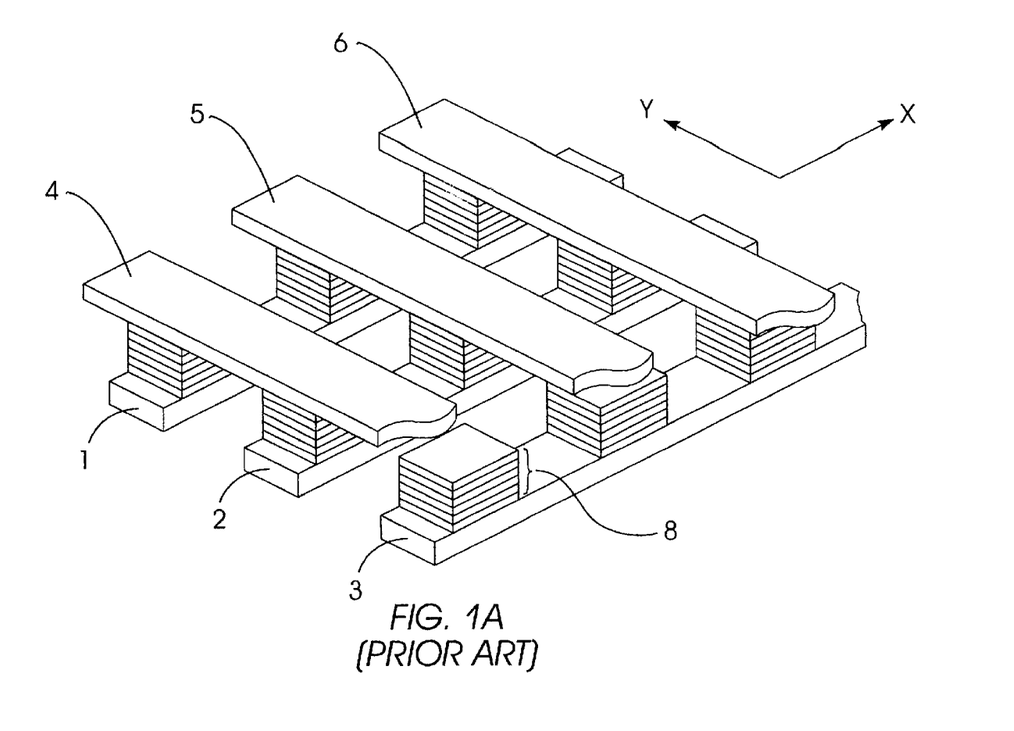
FIG. 1A depicts a prior art MTJ type of MRAM array having magnetic memory cells disposed a the intersecting regions of crossing sense lines and word lines.
Figure 1B:
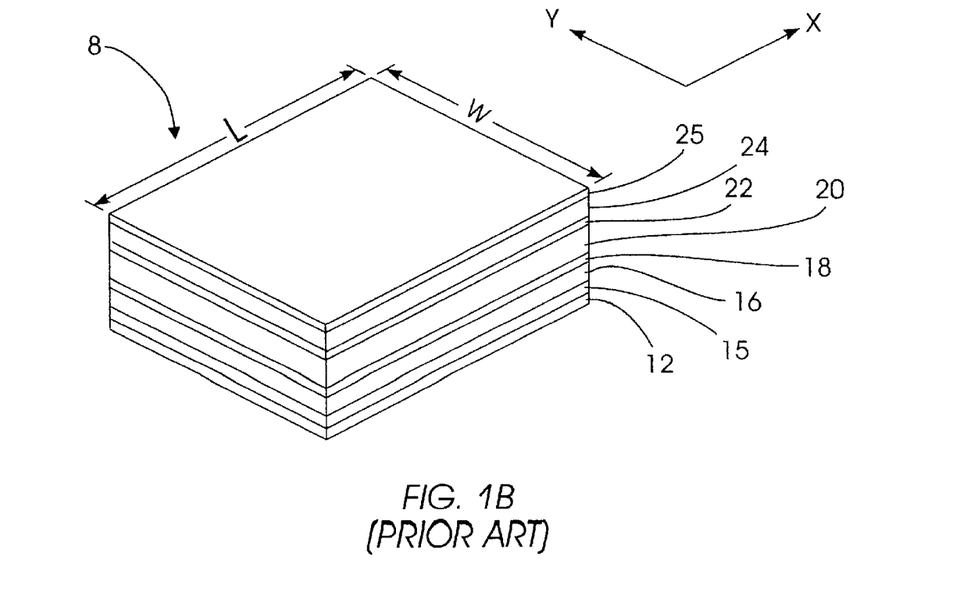
FIG. 1B depicts exemplary layers forming a single one of the magnetic memory cells of the prior art MRAM array of FIG. 1A.

An example of an MTJ MRAM array is shown in FIG. 1A, wherein the MTJ cells are positioned at the intersections of an exemplary rectangular grid of electrically conductive lines 1–6. The MRAM array includes a set of electrically conductive lines that function as parallel word lines 1, 2, and 3 in a horizontal plane, and a set of electrically conductive lines that function as parallel bit or sense lines 4, 5, and 6 in another horizontal plane. The sense lines are oriented in a different direction, e.g., at right angles to the word lines, so that the two sets of lines intersect when viewed from above. A MTJ memory cell, such as typical memory cell 8 shown in detail in FIG. 1B, is located at each crossing point of the word lines and sense lines in the intersection region vertically spaced between the lines. Three word lines and three sense lines are illustrated in FIG. 1A, but the number of lines would typically be much larger. The memory cell 8 is arranged in a vertical stack. During a sensing or reading operation of the array, current flows in a vertical direction through the cell 8. The vertical current path through the memory cell permits the memory cell to occupy a very small surface area. While not shown in FIG. 1A, the array may be formed on a substrate, such as a silicon substrate which contains other circuitry. Also, a layer of insulating material is usually located between the bit lines and word lines at regions of the MRAM array other than the intersecting regions.

As shown in FIG. 1B, the MTJ 8 is formed of a series of layers of material stacked one on top of the other. The MTJ 8 of FIG. 1B comprises a template layer 15, such as Pt, Pd or Ti, an initial ferromagnetic layer 16, such as permalloy (Ni—Fe), an antiferromagnetic (AF) layer 18, such as Mn—Fe, a fixed or "pinned" type of ferromagnetic layer 20, such as Co, Fe or permalloy, that is exchange coupled to the AF layer 18, a thin insulating tunnel barrier layer 22 of alumina ($Al_2O_3$), a free ferromagnetic layer 24, such as a sandwich of thin Co—Fe with permalloy, and a contact layer 25, such as Pt, Pd or Ti.

The free ferromagnetic layer 24 is fabricated to have a preferred axis for the direction of magnetization called the easy-axis. There are two possible directions of magnetization of the free layer 24 along this easy-axis which define the two states of the MTJ memory cell. In contrast, the pinned ferromagnetic layer 20 may be fabricated to have only one preferred direction of magnetization, called its unidirectional anisotropy direction, and this direction is parallel to the easy-axis of the free layer. The desired easy-axis for the free layer is set by some combination of intrinsic anisotropy, strain-induced anisotropy and shape anisotropy of the MTJ. The MTJ and free layer depicted may be made in the shape of a rectangle of length L and width W, where L is larger than W (FIG. 1B). The magnetic moment of the free layer 24 prefers to align along the direction of L.

Magnetostatic Interactions in a MTJ Cell

The magnetostatic coupling between the ferromagnetic layers within a single EB MTJ device must be minimized to assure proper performance of the MTJ MRAM device. The magnetostatic coupling is also called dipolar coupling because the coupling is due to the dipolar fields of the ferromagnetic layers. If the magnetostatic (or dipolar) field from the exchange-biased pinned ferromagnetic layer is not insignificant then the magnetostatic interaction between the pinned and free layers favor an antiparallel orientation of their magnetic moments. Thus, the magnetic hysteresis loop of the free layer becomes asymmetric and will be offset from zero applied magnetic field. It has been found experimentally that the offset field $H_d$ varies approximately as $8M_s t/L$, where t is the thickness of the pinned layer generating the stray fields, L is the length of the junction along the exchange bias direction and $M_s$ is the saturation magnetization. (K. S. Moon, R. E. Fontana and S. S. P. Parkin, "Exchange biased magnetic tunnel junctions: dependence of offset field on junction width", *Appl. Phys. Lett.* 74, p 3690 (1999)). Thus the offset field becomes of ever increasing importance as the size of the MTJ device is decreased. As mentioned above, one method to reduce the offset field is to replace the pinned layer by an antiferromagnetically coupled pinned layer (AP pinned layer) comprised of two antiferromagnetically coupled ferromagnetic layers with a net magnetic moment close to zero. Since the strength of the dipolar field varies with the magnetic moment of the ferromagnetic layer the dipolar field from the AP pinned layer will thus be reduced. However, this solution may not be adequate for a variety of reasons. For example, the stability of such a structure to required thermal anneal treatments during processing may not be as good as a simple exchange-biased pinned layer structure, especially since the antiferromagnetically coupling layer must be very thin. In any case, such a solution does not solve the problem of dipolar fields emanating from the free layer. These fields will interact with the free layers in neighboring memory cells.

Figure 2A:
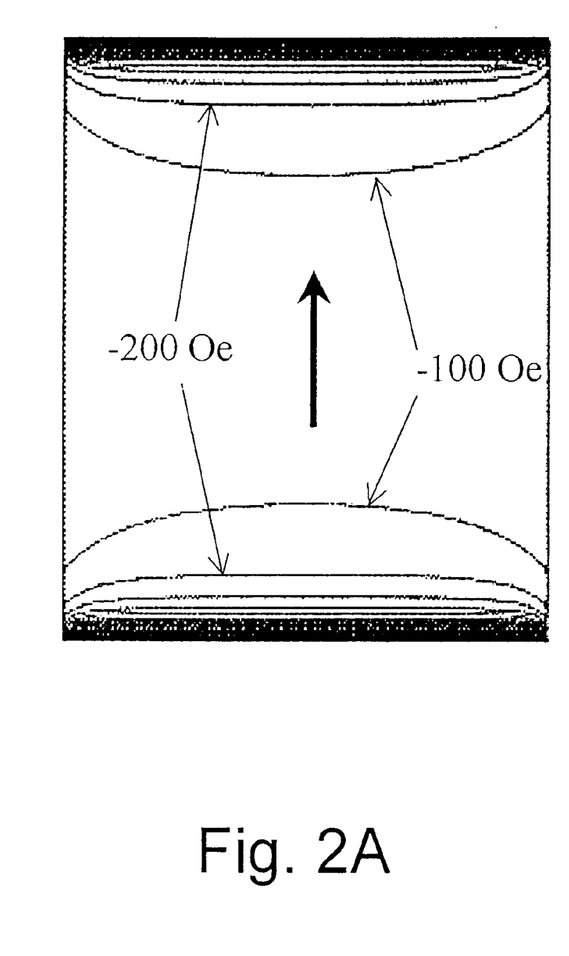
FIGS. 2A and 2B, are magnetic field contour maps for Co films with lateral dimensions of 1×1 $(\mu m)^2$ and 0.2×0.2 $(\mu m)^2$, respectively and iso-field contour lines spaced at 100 Oe and 500 Oe respectively.
Figure 2B:
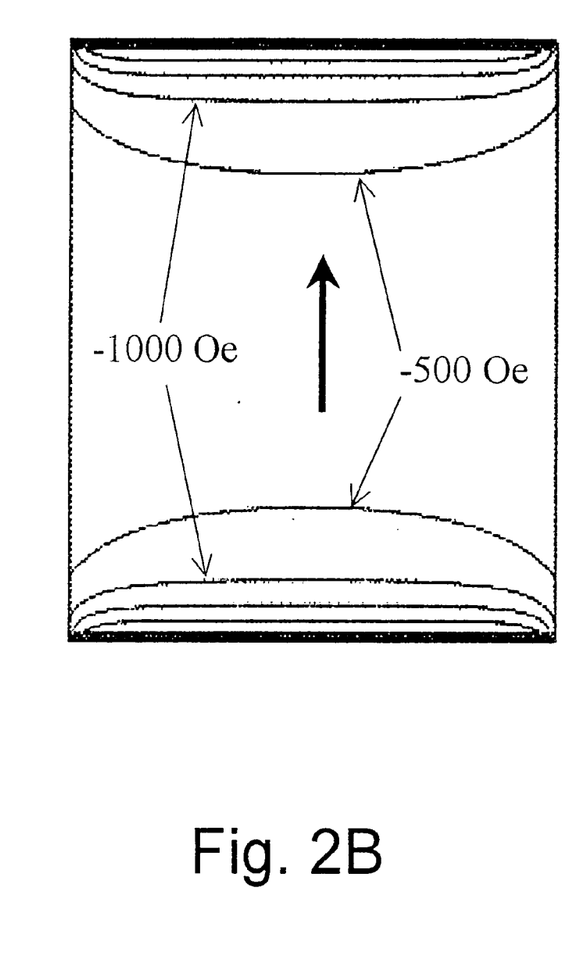

The detailed magnetostatic interactions between the ferromagnetic layers within the MTJ stack are of fundamental interest for the structure of the present invention. Their main features will now be described. The magnetostatic field from a magnetic element is extremely non-uniform within the plane of the element. This is illustrated for two square elements (1 $\mu$m×1 $\mu$m in FIG. 2A, and 0.2 $\mu$m×0.2 $\mu$m in FIG. 2B), each comprised of single layers of Co 75 Å thick. FIGS. 2A–2B show the component of the dipolar field calculated along the magnetization direction of the element (indicated by arrow) in a plane 15 Å above the Co film. Note that this dipolar field is negative i.e. is in the opposite direction to the magnetic moment of the Co film. This field is approximately uniform in the center of the element but diverges near its edges. Note that the other components of the dipolar field are negligible, except in regions very close to the corners of the elements.

Since the magnetostatic coupling field is not uniform within the plane of an MTJ it is not straightforward to derive the offset field exhibited by the MTJ. The offset field will depend not only on the size of the junction but also on the detailed magnetization reversal mechanism. Depending on whether the latter is by nucleation and propagation of magnetic domains or by coherent moment rotation, the offset field will be related to the dipolar field averaged over either the whole volume of the free layer, or a smaller nucleation volume. In the case of large junctions with lateral dimensions of several microns, the best agreement between experiment and theory is obtained when the measured offset field is assumed to be related to the calculated magnetostatic coupling field in the center of the junction, where the field is approximately uniform. The calculated field, averaged over the whole volume of the layer, is significantly larger because of the rapid increase of the dipolar fields near the edges of the cell. On the other hand, numerical simulations of the switching of a much smaller rectangular 30×60×6 nm³ cell junction give offset fields consistent with averaging over the whole volume of the free layer.

However, in all cases, the magnetostatic coupling field will scale approximately with $M_s t$, where $M_s$ and t are the saturation magnetization and thickness, respectively, of the ferromagnetic layer generating the coupling field. Thus the most obvious solution to the stray-field problem is to reduce the thickness of the free layer as the lateral dimensions of the MTJ device are reduced. However, as discussed above, this is usually not possible for a number of reasons, especially the intrinsic roughness of the free layer and the superparamagnetic transition, both of which limit the minimum free layer thickness.

Improved MTJ Cell with Flux-closed Free Layer

Figure 3A:
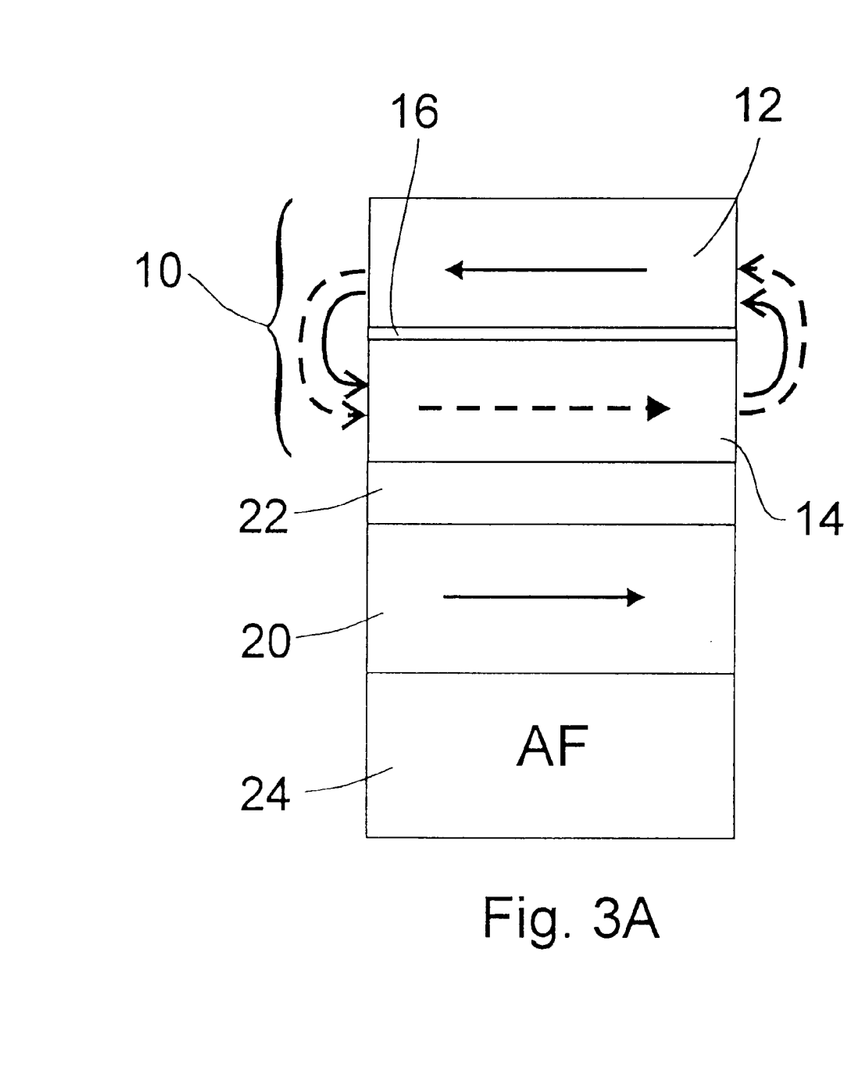
FIGS. 3A and 3b are schematic sectional views of the MTJ cell of the present invention with thermagnetostatically coupled flux-closed free layer, and depicting the two stable magnetic states of the MTJ cell.
Figure 3B:
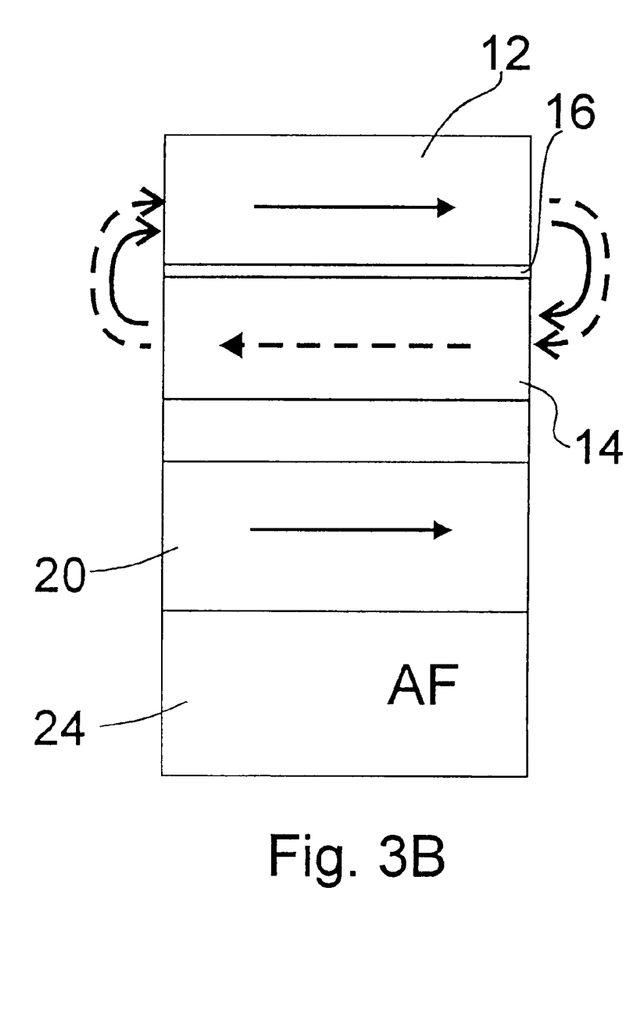

The MTJ structure of the present invention, which reduces the magnetostatic fields arising from the free ferromagnetic layer, is shown in FIGS. 3A–3B. The free layer 10 is comprised of two ferromagnetic films 12, 14, which are coupled to one another predominantly via magnetostatic or dipolar coupling. Free layer 10 is separated from pinned layer 20 by the insulating tunneling barrier layer 22. Pinned layer 20 is exchange-biased by antiferromagnetic (AF) layer 24. The free ferromagnetic films 12, 14 are separated from one another by a spacer layer 16, which acts to prevent the two films 12, 14 from being exchange-coupled to one another.

The spacer layer 16 is chosen so that it does not give rise to significant exchange coupling of the ferromagnetic films. The spacer layer 16 can be formed from a wide variety of metals, semi-metals and semiconducting materials. If the spacer layer is a material such as Ru, Cr or Cu, that are known to provide the oscillatory antiferromagnetic exchange coupling as described in the previously cited Parkin et al. article, then it is selected to have a thickness that does not give rise to exchange coupling of the two ferromagnetic films. The primary requirement is that the resistance of the spacer layer 16 be small compared to that of the tunnel barrier layer 22. Thus the spacer layer 16 can also be formed from an insulating material providing that the resistance of this layer is again small compared to that of the tunnel barrier layer 22. This is possible because the resistance of an insulating layer will vary approximately exponentially with its thickness providing that the layer is uniform and pin-hole free. Thus, for example, it is even possible to make the spacer layer 16 of the same material as the tunnel barrier layer 22 provided that the spacer layer 16 is significantly thinner than that of the tunnel barrier layer 22. This may be an advantage if the deposition system in which the MTJ structure is deposited has a limited number of materials from which the layers of the MTJ structure can be formed. Typically the tunnel barrier 22 is formed from a thin layer of $Al_2O_3$ whose electrical properties are such that the resistance of such a layer will increase by a factor of 5–10 by increasing its thickness by approximately 1–2 Angstrom. Thus if the spacer layer 16 is made ~1–2 Angstrom thinner than the tunnel barrier 22 the resistance of the spacer layer can readily be made to be 10–20 times lower than that of the tunnel barrier. Thus when a current is passed through the MTJ structure of the present invention for reading the state of the MTJ the voltage across the device would largely be across the tunnel barrier 22 and thus the presence of the insulating spacer layer 16 would not significantly diminish the read signal. Since the layer 22 may be quite thin for optimal performance of the MTJ MRAM memory cell it may not be useful to form the spacer layer 16 from the same insulating material as 22 but rather it may be preferred to form the spacer layer 16 from an insulating material with a lower energy band gap and consequently lower resistance for otherwise the same thickness of insulating film.

The properties of the spacer layer 16 are chosen with regard to the particular application of the MTJ device. For example, the spacer layer can be formed from a material which acts as a thermal diffusion barrier for the material comprising the ferromagnetic films within the magnetostatically coupled free layer combination so that the MTJ device has good thermal stability. For example TiN is a suitable spacer layer material because it is thermally stable and does not interact with the materials of the ferromagnetic films. Unlike antiferromagnetic coupling layers used in AP pinned layers, the thickness of the spacer layer does not need to be extremely thin, although its thickness must be much smaller than the lateral dimensions of the MTJ cell and its resistance must be much smaller than that of the tunnel barrier layer 22. This latter criterion is only important if the spacer layer 16 were chosen to be formed from an insulating material. If the spacer layer 16 is formed from a metallic layer then it can be made very thick compared to the thickness of the tunnel barrier 22. One advantage of certain insulating materials is that they can be highly thermally stable. For example, thin films of $Al_2O_3$ are stable to temperatures well above 400–500° C. For MTJ MRAM applications where the MTJ memory elements may be subjected to temperatures in the range 350–450° C. in the final temperature anneal in the back end of the line process it may be important to form MTJ structures which can withstand temperatures as high as 350–450° C.

The material from which the spacer layer 16 is formed may also be chosen for its suitability as an underlayer for the growth of layer 12 in addition to requirements on its resistance and thermal stability. The magnetic properties of layer 12, in particular, its coercivity, will depend on its structure which, in turn, will be influenced by the layer on which it is grown. In this regard it may be preferred not to form layer 16 from an insulating material but rather from a metallic material. Suitable underlayer materials will depend on the ferromagnetic material from which layer 12 is formed. For example, suitable underlayers for ferromagnetic layers of Co or Ni—Fe alloys are nonferromagnetic elemental layers such as Ti, Zr, Hf, Cu, Cr, Ru, Rh, Pt, and Pd, or nonferromagnetic binary alloys, such as $Cu_{1-x}Ni_x$ (x<0.5) or $Ni_{1-x}Cr_x$, or nonferromagnetic ternay alloys such as $Ni_{1-x}Fe_xCr_y$. All of these materials can be used to from the spacer layer 16.

The two different orientations of the magnetic moments of the ferromagnetic films in zero magnetic field within the magnetostatically (MS) coupled free layer 10 of the MTJ device are shown in FIGS. 3A–3B for an exchange-biased MTJ in its low and high resistance states. As illustrated, the orientation of the magnetic moment of the MS free film 14 at the interface with the tunnel barrier layer 22 determines the resistance of the MTJ device. The magnetic moment of the free ferromagnetic film 12 is depicted as being less than that of the free ferromagnetic film 14 (the arrow for film 12 is shorter than the arrow for film 14), so that the net magnetic moment of the free layer 10 is less than the absolute sum of the magnetic moments of the two films 12, 14. Thus, the MS free layer 10 in this structure exhibits a reduced net dipolar field, thereby reducing the magnetostatic interaction between the MS free layer 10 and the pinned layer 20 and with neighboring MTJ cells. This structure also allows the use of individual ferromagnetic films within the free layer which have larger magnetic moments than would be possible with simple single-layer free films, thereby extending the superparamagnetic limit.

Analytical Model of Two Magnetostatically Coupled Ferromagnetic Films

An analytical model of the magnetic switching of MS coupled free layer 10 as a function of applied magnetic field will be described. For illustration purposes several simplifying approximations will be made. The pinned layer 20 is not part of this discussion. In general, the pinned layer 20 will interact with the free layer 10 both through Néel "orange-peel" coupling through the tunneling barrier layer 22, and through the magnetostatic (dipolar) stray fields generated by the pinned layer. However, the orange-peel coupling will usually be a relatively small effect. The magnetostatic interaction of the pinned layer can largely be eliminated by the use of an AP pinned layer. The free ferromagnetic films 12, 14 comprising the free layer 10 are also assumed to exhibit square magnetic hysteresis loops such that their magnetization lies essentially along their easy axes. It is further assumed in this analytical model that the magnetization reversal of the films 12, 14 is essentially via a coherent rotation mechanism in which the magnetization of these layers remains uniform within these layers.

Thus two ferromagnetic films 12, 14 are considered, with thicknesses of $t_1$ and $t_2$ and which have the same shape and size with area S. The films have magnetization values (magnetic moment per unit volume) of $M_1$ and $M_2$, and coercivities of $H_{c1}$ and $H_{c2}$, respectively. The two ferromagnetic films interact with each other only through magnetostatic or dipolar stray fields at their edges. The interaction energy of the two films is clearly a minimum when their moments are antiparallel to one another, and takes a value given by $$E_i = -H_{d1}M_2t_2S = -H_{d2}M_1t_1S \qquad (1)$$

where $H_{d1}$ is the effective magnetic coupling field created by the first film 12 on the second film 14 and $H_{d2}$ is the effective magnetic coupling field created by the second film 14 on the first film 12. Note that, as discussed above and illustrated in FIGS. 1A–1B, even though the magnetization is assumed uniform in these films, the dipolar fields generated by these films are not homogeneous throughout the volume of these films. Nevertheless, one can describe the magnetostatic interaction in terms of an effective magnetic coupling field. The most important consequence of this field is an offset in the magnetic hysteresis loop of the film subjected to this field. The field $H_{d1}$ is an effective field by which the hysteresis loop of the second film would be offset from zero applied magnetic field. The second field $Hd_{d2}$ is defined in the same way. It is assumed that the coupling fields are essentially parallel to the easy axis of the films. From the definition of the interaction energy above one obtains the following important relation between the parameters, $$H_{d1}/H_{d2} = (M_1t_1)/(M_2t_2) \qquad (2)$$

By convention, in this discussion all the parameters are chosen to be positive.

Note that the dipolar field generated by one film magnetized along one direction gives rise to a dipolar field along the opposite direction for the second film. The effect of an external field on the films 12, 14 will be modified by the presence of these dipolar fields. In the absence of the dipolar fields the films 12, 14 will switch their magnetic moments at their respective coercivities $H_{c1}$ and $H_{c2}$. By considering the combination of the external field and the dipolar fields acting on each of the films 12, 14, in relation to the coercivities of these films $H_{c1}$ and $H_{c2}$, one can derive the fields at which the moments of 12, 14 in the MS coupled free layer 10 will switch as a function of varying external magnetic field. As the external field is varied the moments of 12, 14 may switch back and forth more than once as the external field is varied from large positive to large negative fields (and vice versa) because the dipolar fields seen by films 12 and 14 may be of opposite sign to the external field (depending on the orientation of the magnetizations of the films 12, 14) and, moreover, the dipolar fields to which these films are subjected will change in direction when the moment of the relevant film is reversed. This leads to several possible magnetic hysteresis loops for the free layer 10.

Figure 4:
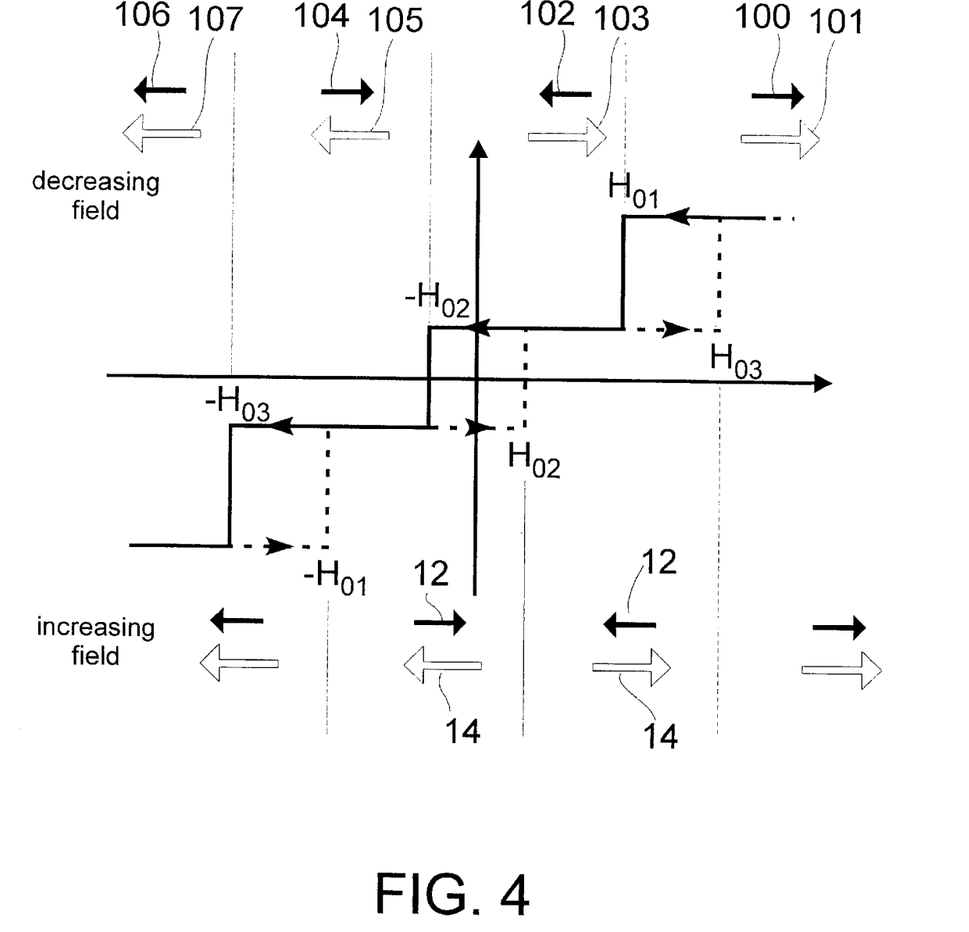
FIG. 4 is a magnetic hysteresis loop for the MTJ cell of the present invention with the magnetostatically coupled flux-closed free layer wherein the solid and dashed lines represent the hysteresis loop for the applied field decreasing from positive to negative fields and from negative to positive values, respectively.

The magnetic hysteresis loop of interest for the present invention is shown in FIG. 4. In this case the free layer 10 exhibits two stable flux-closed states in zero field with reduced net moments. The solid and dashed lines in FIG. 4 represent the hysteresis loop for the applied field decreasing from positive to negative fields and from negative to positive values, respectively. The orientation of the magnetic moments of the films 12, 14 of the free layer 10 are shown schematically in FIG. 4 as solid and open arrows, respectively, corresponding to the various magnetic states of the free layer. The free layer 10 exhibits two stable flux-closed states in zero field in which the moments of films 12 and 14 are antiparallel to one another, but the larger of the two moments will be aligned along the applied field direction except at small magnetic fields compared to the coercivities of films 12 and 14 because of magnetic hysteresis (see FIG. 4). The magnetic hysteresis loop of FIG. 4 is found in the model described above when the following condition is met:

$$Hd_2 - Hd_1 > Hc_1 + Hc_2 \qquad (3)$$

This condition is readily obtained as follows.

As shown in FIG. 4 the hysteresis loop has three characteristic or critical fields, $H_{on}$ (n=1,2 and 3) at which the orientation of the magnetizations of the films 12, 14 within the free layer 10 will undergo abrupt changes. The magnetic orientations of these films are indicated by the arrows 100–107. Film 14 will have a larger magnetic moment than film 12, as indicated by the larger arrow 101. When a large positive field is applied to the free layer 10 (along the easy axis of the free layer) both the moments of both films 12 and 14 will be aligned with this field, as shown by the arrows 100, 101. As the magnitude of this field is reduced, at a first critical field $H_{01}$ the magnetic moment of the lower moment free film 12 will reverse its orientation to become antiparallel to that of the higher moment free film 14 (as shown by the arrows 102, 103 in FIG. 4) and antiparallel to the applied field. This reversal will happen when the dipolar field which film 12 is subjected to from film 14 becomes larger than the applied field and when this difference in fields is larger than $H_{c1}$, the intrinsic switching field of film 12. Thus it is clear that $H_{01}$ is related to $H_{d2}$ and $H_{c1}$ by the condition $H_{d2} - H_{01} = H_{c1}$. As the applied field is further reduced through zero field the moments of both films 12 and 14 reverse themselves substantially simultaneously at a second critical field $-H_{o2}$. This process can be thought of as occurring in two steps. First the larger moment film 14 will reverse its magnetization direction. This will occur when the field which the larger moment film 14 is subjected to, namely the difference between the applied field –H and the dipolar field from the film 12, $H_{d1}$, is greater than the coercivity of film 14, $H_{c2}$. Thus $H_{02}$ is defined by the relation $H_{02} - H_{d1} = H_{c2}$. Once the larger moment film 14 has reversed its moment then film 12 will reverse its moment at the same field $-H_{o2}$. This leads to the magnetic state indicated by the arrows 104 and 105 in FIG. 4. Finally, as the applied field becomes more negative the moment of film 12 will reverse itself to become parallel to the applied field (and to the moment of film 14) at a critical field $H_{O3}$, leading to the magnetic state indicated by the arrows 106, 107. This will occur when $H_{o3} - H_{d2} = H_{c1}$.

In order for the free layer 10 to exhibit the useful magnetic hysteresis loop shown in FIG. 4, in addition to the relations between $H_{o1}$ and $H_{o2}$ and the coercivities and dipolar fields of the films 12 and 14, it is required that $$H_{01} > H_{02}$$

By using the relations $H_{01} = H_{d2} - H_{c1}$ and $H_{02} = H_{d1} + H_{c2}$, we derive the important condition:

$$Hd_2 - Hd_1 > Hc_1 + Hc_2$$

which is equation (3) introduced above. (Note that if the moment of film 12 is larger than the moment of film 14 then the condition would be $H_{d1} - H_{d2} > H_{c1} + H_{c2}$). Since the dipolar field is proportional to the magnetic moment of the corresponding film then the required condition can also be written as:

$$D^* |M_1 t_1 - M_2 t_2| > H_{c1} + H_{c2} \qquad (4)$$

where D is a scaling factor which relates the magnetic moments of the films 12 and 14 to their dipolar fields. D depends in detail on the shape and size of the films 12 and 14 as well as their surface and edge topologies.

Thus in order to obtain the useful magnetic hysteresis loop shown in FIG. 4 with two stable flux-closed states near zero applied field the free layer 10 must be comprised of two ferromagnetic films 12, 14 with sufficiently different magnetic moments. As used herein "magnetic moment" can mean either the total magnetic moment of a ferromagnetic layer or film, or the magnetic moment per unit area. In the MTJ cells described herein, all of the ferromagnetic films have the same area. Because M is called the magnetization or magnetic moment per unit volume, M×t is the magnetic moment per unit area. The requirement of equation (4) can be obtained by forming these films from the same ferromagnetic material but by using films with different thicknesses. Alternatively, the films 12, 14 can be made from different ferromagnetic materials with different magnetization values (moment per unit volume) and may be of the same thickness. For a useful device $H_{o1}$ must be significantly larger than $H_{o2}$. This is obtained by proper choice of the coercivity and magnetic moments of layers 12 and 14 according to the conditions discussed above.

As shown above, it is possible to obtain a useful free layer 10 comprised of two ferromagnetic films 12, 14 coupled only by magnetostatic coupling across a spacer layer 16 that has a thickness to prevent exchange coupling. For a certain applied field range, the free layer structure exhibits two stable states in both of which the moments of the two ferromagnetic films 12, 14 are antiparallel to one another. In order to obtain this behavior the coercivities and magnetic moments of the ferromagnetic films 12, 14 must be carefully chosen, according to the formulae given above. By combining such a flux-closed free layer with a fixed magnetic layer in a MTJ device a structure similar to that illustrated in FIGS. 3A–3B is obtained. In small magnetic fields such an MTJ device will exhibit two stable states, one of which has low resistance and one of which has high resistance. For both of these states, the net magnetic moment of the free layer 10 can be significantly reduced compared to a free layer comprised of a single ferromagnetic layer. Moreover, as shown in FIG. 4, it is possible to switch the magnetic state of the magnetostatically coupled free layer 10 without its net moment becoming large (i.e., the moments of the films 12, 14 do not become aligned parallel to one another), provided that the magnitude of the applied field does not exceed $H_{o3}$. Since the dipolar magnetic fields of the films 12, 14 are approximately proportional to the net magnetic moment of the MS coupled free layer 10, the coupling fields between the free and fixed layers within an MTJ cell and between neighboring MTJ cells within an MRAM array can thus be greatly reduced.

Such a flux-closed free layer will also be more stable against thermal fluctuations because each of the ferromagnetic films 12, 14 in the free layer 10 is subjected to a stabilizing magnetic field from the other film in the free layer.

A particularly interesting feature of the MS coupled flux-closed free layer according to the present invention is that its switching field $H_{o2}$ only depends on $H_{d1}$, i.e., the thickness and magnetization of film 12, and $H_{c2}$, the coercivity of film 14. The coercivity of film 12 is not directly relevant. It is then possible to use a comparatively magnetically hard (i.e., high coercivity) film as a part of this structure provided $|H_{d1}-H_{d2}|$ is greater than $H_{c1}+H_{c2}$. In other words, the dipolar field created by the other ferromagnetic film within the MS coupled free layer assists the reversal of the magnetization direction of the hard film within the free layer. This may be useful. For example, to obtain as high as possible a magnetoresistance of the MTJ device it may be useful to use a ferromagnetic material at the interface with the tunneling barrier 22 which may have such a high coercivity that it would not be possible to use this material in a MTJ device with a single-film free layer. For example a film of an Fe-rich Co—Fe alloy, which otherwise would have too high a coercivity in a single-film free layer, could be used.

Figure 5:
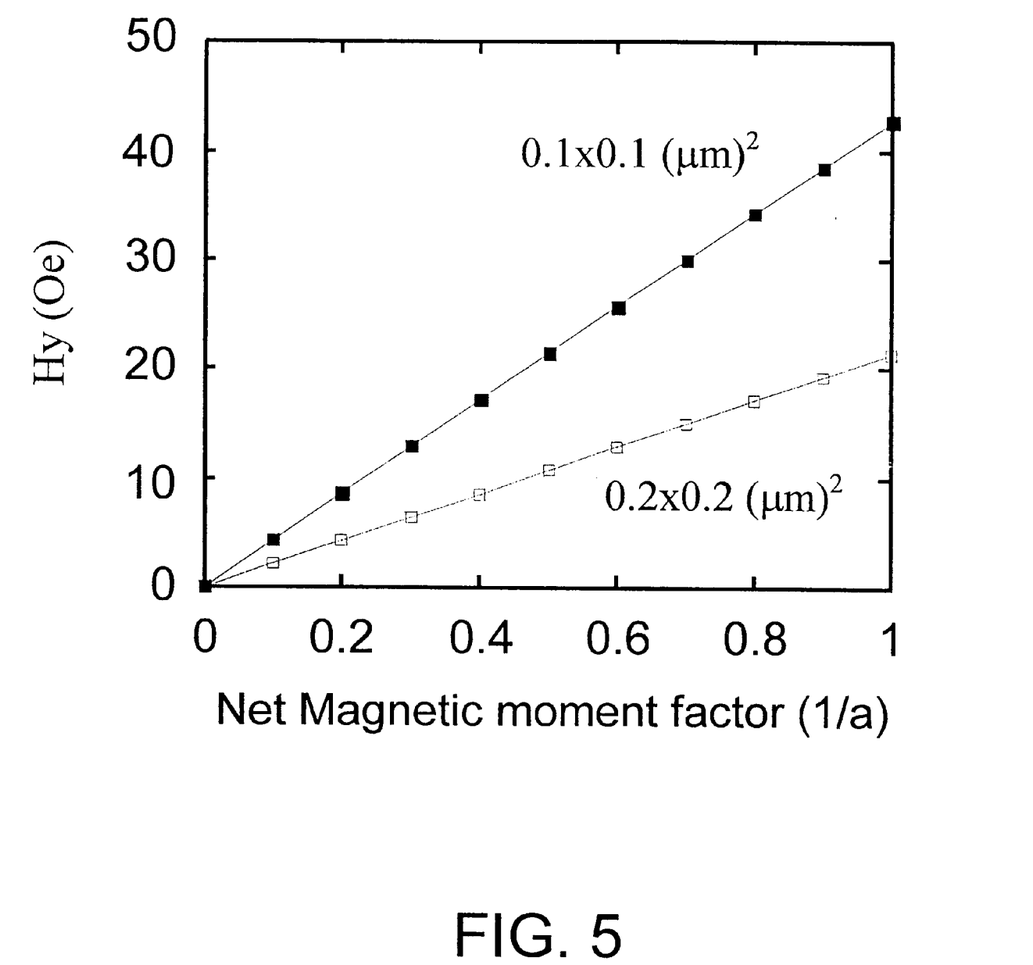
FIG. 5 is a graph of inter-cell coupling field strength in an MRAM array as a function of the net magnetic moment factor of the magnetostatically coupled free layer in the MTJ cells making up the array.

Finally, a simple calculation is made to demonstrate the advantage of the flux-closed free layer with regard to the reduction of inter-cell dipolar fields in an MRAM array. The inter-cell coupling field is calculated as a function of the normalized net magnetic moment of the magnetic cell, $(|M_2t_2-M_1t_1|)/(M_2t_2+M_1t_1)=1/a$. $1/a$ represents the factor by which the sum of the magnetic moments of films 12 and 14 is reduced in the MS free layer 10. The average value of the inter-cell coupling field $H_y$ (along the magnetization direction of the cells) within the plane of the cell is calculated in the plane, and plotted as a function of $1/a$ in FIG. 5. Results are included in FIG. 5 for an array of 0.2×0.2 $(\mu m)^2$ cells separated by 0.2 $\mu m$ and for a more compact array with 0.1×0.1 $(\mu m)^2$ cells separated by 0.1 $\mu m$. As shown in FIG. 5 the coupling field can be greatly reduced using such a flux-closed structure. In the case of perfect compensation ($1/a=0$), there is no inter-cell coupling field. For incomplete compensation, if $M_1=M_2$, the dipolar coupling field varies linearly with the net magnetic moment.

As mentioned above, the maximum field applied to a cell $H_m$ has to be smaller than $H_{o3}$, otherwise the cell would temporarily be in a ferromagnetic configuration, which would give rise to much larger stray fields. On the other hand, this maximum field has to be larger than the switching field of the device $H_{sw}=H_{o2}$. Indeed, because of the likely distribution of switching fields in an array (due, for example, to small differences in the sizes of the cells), the field applied during the write-read process must be larger than $H_{o2}$ by a sufficient margin to insure that any chosen cell switches. Moreover, the switching speed will be increased if the applied field is significantly larger than the switching field so it may be useful to apply fields significantly greater than $H_{sw}$ even though this will require more power. Thus, for these reasons, there should be an appreciable difference between $H_{o2}$ and $H_{o3}$.

Consider an MTJ memory cell for which the free layer should have a switching field of ~20–40 Oe. This is a reasonable switching field which is large enough that typical environmental fields will not perturb the memory cell but not so large as to require unreasonably high write currents. Thus $H_{sw}=(H_{d1}+H_{c2})$ (i.e. $H_{o2}$)>>20–40 Oe. Then it is required that $H_m(<(H_{d2}+H_{c1})$ i.e. $H_{o3}$) is n times larger than $H_{sw}$ with, for example, n>3. Finally, require that a>1, where, as defined above, $1/a=|(M_1t_2-M_1t_1)|/(M_2t_2+M_1t_1)$, so that the net moment of the free layer 10 is significantly reduced compared to the sum of the moments of the films 12 and 14. Two important quantities are the net magnetic moment factor, $1/a$, and the margin, n, the ratio of the maximum field which can be applied to the cell without disturbing it, divided by the switching field of the cell.

It is useful to rewrite the ratio of the dipolar fields to which the films 12 and 14 are subjected in terms of a as follows:

$$H_{d1}/H_{d2}=(M_1t_1)/(M_2t_2)=(a-1)/(a+1) \tag{5}$$

Now the condition (equation 3 above) required for the free layer 10 to exhibit a useful magnetic hysteresis loop can be rewritten in terms of a as follows:

$$H_{d2}-H_{d1}=2H_{d2}/(a+1)>H_{c1}+H_{c2} \tag{6}$$

The cell must be designed such that $H_{sw}$ is within the desired range, whereas a and n must be as large as possible so as to obtain the largest possible reduction of the moment of the free layer 10 and the largest possible maximum operating field range.

Note that when a increases, i.e., the net magnetic moment of the free layer 10 goes to zero, this requires that the difference between $H_{d1}$ and $H_{d2}$ decreases, and that the coercivities of the films have to be small to fulfill equation 4. In the limit of perfect compensation (a tends to infinity), $H_{d2}-H_{d1}$ tends to zero, and then, equation 4 is only satisfied for $Hc_1\sim Hc_2\sim 0$. Moreover, in this case, n=1, which is not useful. Thus there is a practical limit to the maximum value of a and the extent to which the net moment of the flux closed free layer can be reduced.

If one now assumes that the two films are extremely soft magnetic materials, namely, $Hc_1\sim Hc_2\sim 0$, it can then easily be shown that the two constraints n and a are connected to each other by the relation:

$$a=(n+1)/(n-1) \tag{7}$$

If, for example, $H_m=4H_{sw}$ then a=5/3. The net magnetic moment cannot be smaller than 3/5. On the contrary, if a=10 (the net magnetic moment is 10%), then $H_m$ cannot be bigger than $11/9H_{sw}$. What this means is that as the net moment of the free layer 10 is reduced by greater compensation of the magnetic moments of films 12 and 14 then the maximum field for which these films remain compensated with their moments antiparallel to one another is reduced. Thus a compromise has to be made between the moment and the stability of the low moment state of free layer 10 to magnetic field.

A general case will now be described, for which the coercivities of the magnetic films are not zero. The constraint equation $H_m = nH_{sw}$ can be rewritten as a function of the parameters of the problem: $H_{d2}[1-n(a-1)/(a+1)] = nH_{c2} - H_{c1}$. If both n and a are as large as possible, this means that $n(a-1)/(a+1)$ is larger than unity, and consequently that $nH_{c2} - H_{c1}$ has to be smaller than zero. Then $H_{c2} \sim 0$ and $H_{c1}$ needs to be as large as possible. Assume that $H_{c2} = 0$. The maximum value of $H_{c1}$ is then given by equation (3): $H_{c1} < H_{d2} - H_{d1} = 2H_{d2}/(a+1)$. Under these conditions, n and a are related to each other by the equation:

$$a = (n+3)/(n-1) \qquad (8)$$

If, as above, $H_m = 4H_{sw}$, then a=7/3 i.e. the net magnetization is 3/7. If a=10, then $H_m = 13/9 H_{sw}$. This case is obviously better than the former one.

Thus, in conclusion, the best situation is obtained with $H_{c2} \sim 0$ and $H_{c1} < 2H_{d2}/(a+1)$. Under these conditions, a and n can be optimized according to the relation $a = (n+3)/(n-1)$. The parameters of the two films for this optimum case are summarized in Table 1.

TABLE 1

Optimum parameters for flux-closed free layer

| Film #1: | Film #2: |
|---|---|
| Hard: $H_{c1} \sim 2H_{d2}/(a+1)$ | Soft: $H_{c2} \sim 0$ |
| "Thin": $M_1 t_1 \ll 1$ | "Thick": $M_2 t_2 \gg 1$ |
| High magnetization | Low magnetization |

In the following example it is demonstrated that the flux-closed free layer structure allows the use of magnetic layers which, by themselves, have higher switching fields than that of the flux-closed structure. Consider, for example an MTJ of size 0.5×0.5 $(\mu m)^2$, which has a single-layer CoFe free layer with a saturation magnetization, $M_{s2} = 2000$ emu/cm$^3$, and a coercivity, $H_{c2} = 50$ Oe. It would be very useful to use such a CoFe layer in an MTJ device because such a layer, with a relatively high Fe content, gives rise to high MR. However its switching field may be too high for a MRAM application for which a lower switching field of perhaps $H_{sw} = 30$ Oe would be preferable.

Consider replacing the CoFe single free layer film by a MS coupled flux-closed double-layer structure according to the present invention, in which the second ferromagnetic film is formed from permalloy, which is magnetically soft with $H_{c1} = 5$ Oe and with a magnetization $M_{s1} = 800$ emu/cm$^3$.

The switching field of the flux-closed double-layer structure is given by $H_{d2} + H_{c1}$. Thus, in order to obtain a switching field of 30 Oe, the thickness of the CoFe layer must be chosen such that $H_{d2} = 25$ Oe, which corresponds, from analytical calculations to an approximately 1 nm thick layer, assuming a 1 nm thick spacer layer. The thickness of the permalloy (NiFe) layer is determined by equation (4), $H_{d1} > 25 + 50 + 5 = 80$ Oe. Thus if $H_{d1} = 85$ Oe, the permalloy layer must be ~9 nm thick.

Using these thicknesses, a=1.77 and the net magnetic moment of the flux-closed structure is 56% of the absolute sum of the moments of the two films. The maximum field $H_m$ is 90 Oe, three times the switching field of the structure (n=3). The order of magnitude of the inter-cell coupling field can be estimated. Assuming a square array, in which the spacing between the cells is equal to the size of the cells, the coupling field is below 10 Oe (its average value over the area of the junction is about 5 Oe). By comparison, the maximum coupling field would be 17 Oe if the moments of the two films 12 and 14 were aligned parallel. These results are summarized in Table 2.

TABLE 2

Parameters for a flux-closed CoFe/permalloy structure

| Film #1: | Film #2 |
|---|---|
| permalloy | CoFe |
| $Ms_1$ = 800 emu/cm$^3$ | $Ms_2$ = 2000 emu/cm$^3$ |
| $H_{c1}$ = 5 Oe | $H_{c2}$ = 50 Oe |
| t = 9 nm | t = 1 nm |
| $H_{sw}$ = 30 Oe | |
| $H_m$ = 90 Oe | |
| Net magnetic moment: 56% | |
| Maximum inter-cell coupling field: 10 Oe | |

While the invention has been particularly shown and described with reference to preferred embodiments thereof, it will be understood by those skilled in the art that various changes in form and details may be made therein without departing from the spirit and scope of the invention.

What is claimed is:

1. A magnetic tunnel junction device comprising:
    a fixed ferromagnetic layer whose magnetic moment is fixed in a preferred direction in the presence of an applied magnetic field;
    a free ferromagnetic multilayer comprising a first ferromagnetic film having its magnetic moment oriented in a first direction, a second ferromagnetic film having its magnetic moment oriented in a second direction substantially antiparallel to said first direction, and a non-ferromagnetic spacer layer located between and in contact with said first and second ferromagnetic films and having a thickness sufficient to prevent exchange coupling between the first and second ferromagnetic films, the ferromagnetic multilayer having a net magnetic moment oriented substantially in one of said first and second directions in the absence of an applied magnetic field, and the magnetic moments of the first and second ferromagnetic films being magnetostatically coupled across the spacer layer so as to be free to rotate substantially simultaneously in the presence of an applied magnetic field so that the net magnetic moment of the ferromagnetic multilayer can be oriented in the other of said first and second directions in the presence of an applied magnetic field; and
    an insulating tunneling layer located between and in contact with the fixed ferromagnetic layer and the free ferromagnetic multilayer for permitting tunneling current between the fixed ferromagnetic layer and the free ferromagnetic multilayer.

2. The magnetic tunnel junction device according to claim 1 wherein the first ferromagnetic film has a thickness t1 and a magnetization M1, the second ferromagnetic film has a thickness t2 and a magnetization M2, and wherein the magnetic moments per unit area (M1×t1) and (M2×t2) of the first and second ferromagnetic films, respectively, are different from one another.

3. The magnetic tunnel junction device according to claim 2 wherein the first and second ferromagnetic films are formed of the same material, and wherein t1 is different from t2.

4. The magnetic tunnel junction device according to claim 2 wherein the first and second ferromagnetic films are formed of different materials and wherein t1 and t2 are substantially the same thickness.

5. The magnetic tunnel junction device according to claim 2 wherein the first and second ferromagnetic films have coercivities Hc1 and Hc2, respectively, and wherein the first and second ferromagnetic films subject the other film to a dipolar field of magnitude Hd1 and Hd2 respectively and wherein the absolute value of (Hd1−Hd2) is greater than (Hc1+Hc2).

6. The magnetic tunnel junction device according to claim 1 further comprising an antiferromagnetic layer in contact with the fixed ferromagnetic layer for fixing the magnetic moment of the fixed ferromagnetic layer in said preferred direction by interfacial exchange coupling.

7. The magnetic tunnel junction device according to claim 1 wherein the spacer layer is a metallic material.

8. The magnetic tunnel junction device according to claim 7 wherein the spacer layer is selected from the group consisting of Cu, Pd, Pt, Rh, Ti, Cr, Ru and Os.

9. The magnetic tunnel junction device according to claim 7 wherein the spacer layer is a binary metallic material selected from the group consisting of $Cu_{(1-x)}Ni_x$ and $Ni_{(1-x)}Cr_x$.

10. The magnetic tunnel junction device according to claim 7 wherein the spacer layer is a ternary metallic alloy of Ni—Fe—Cr.

11. The magnetic tunnel junction device according to claim 7 wherein the spacer layer is TiN.

12. The magnetic tunnel junction device according to claim 1 wherein the spacer layer is an insulating material.

13. The magnetic tunnel junction device according to claim 12 wherein the spacer layer is formed of $Al_2O_3$.

14. The magnetic tunnel junction device according to claim 1 wherein the spacer layer is a semiconducting material.

15. The magnetic tunnel junction device according to claim 1 further comprising a substrate, and wherein the fixed ferromagnetic layer, the insulating tunneling layer and the free ferromagnetic multilayer are formed on the substrate, whereby tunneling current passes through the insulating tunneling layer in a direction generally perpendicular to the fixed ferromagnetic layer and free ferromagnetic multilayer when the fixed ferromagnetic layer and free ferromagnetic multilayer are connected to electrical circuitry.

16. A nonvolatile magnetic memory array of magnetic tunnel junction memory cells comprising:

a substrate;

a first set of generally parallel electrically conductive lines formed on the substrate;

a second set of generally parallel electrically conductive lines formed on the substrate generally perpendicular to the first set of lines to define a plurality of intersection regions;

an array of magnetic tunnel junction cells, each cell being formed at an intersection region on the substrate and comprising a magnetic tunnel junction device as claimed in claim 1.

17. A magnetic tunnel junction device comprising:

a fixed ferromagnetic layer whose magnetic moment is fixed in a preferred direction in the presence of an applied magnetic field;

a free ferromagnetic multilayer comprising (a) a first ferromagnetic film having a thickness t1, a magnetization M1 and a coercivity Hc1 and having its magnetic moment oriented in a first direction, (b) a second ferromagnetic film having a thickness t2, a magnetization M2 and a coercivity Hc2 and having its magnetic moment oriented in a second direction substantially antiparallel to said first direction, the magnetic moments per unit area (M1×t1) and (M2×t2) of the first and second ferromagnetic films, respectively, being different from one another, and (c) a nonferromagnetic spacer layer located between and in contact with said first and second ferromagnetic films and having a thickness sufficient to prevent exchange coupling between the first and second ferromagnetic films, and wherein the first and second ferromagnetic films separated by said spacer layer subject each other to a dipolar field of magnitude Hd1 and Hd2, respectively, the absolute value of (Hd1−Hd2) being greater than (Hc1+Hc2);

wherein the ferromagnetic multilayer has a net magnetic moment oriented substantially in one of said first and second directions in the absence of an applied magnetic field, and the magnetic moments of the first and second ferromagnetic films are magnetostatically coupled across said spacer layer so as to be free to rotate substantially simultaneously in the presence of an applied magnetic field so that the net magnetic moment of the ferromagnetic multilayer can be oriented in the other of said first and second directions in the presence of an applied magnetic field; and an insulating tunneling layer located between and in contact with the fixed ferromagnetic layer and the free ferromagnetic multilayer for permitting tunneling current between the fixed ferromagnetic layer and the free ferromagnetic multilayer.

* * * * *